US011772278B2

(12) United States Patent
Lee et al.

(10) Patent No.: US 11,772,278 B2
(45) Date of Patent: Oct. 3, 2023

(54) END EFFECTOR MEASURING MODULE AND END EFFECTOR MONITORING APPARATUS USING THE SAME

(71) Applicant: Kyu Ok Lee, Seongnam-si (KR)

(72) Inventors: Kyu Ok Lee, Seongnam-si (KR); Jin Hee Lim, Seongnam-si (KR)

(73) Assignee: Kyu Ok Lee

( * ) Notice: Subject to any disclaimer, the term of this patent is extended or adjusted under 35 U.S.C. 154(b) by 327 days.

(21) Appl. No.: 17/306,859

(22) Filed: May 3, 2021

(65) Prior Publication Data

US 2021/0252717 A1 Aug. 19, 2021

Related U.S. Application Data

(63) Continuation-in-part of application No. PCT/KR2019/015769, filed on Nov. 18, 2019.

(51) Int. Cl.
*H01L 21/67* (2006.01)
*B25J 13/08* (2006.01)
*B25J 9/16* (2006.01)
*B25J 11/00* (2006.01)

(52) U.S. Cl.
CPC ........... *B25J 13/088* (2013.01); *B25J 9/1664* (2013.01); *B25J 11/0095* (2013.01); *B25J 13/087* (2013.01)

(58) Field of Classification Search
CPC ...... B25J 13/087; B25J 13/088; B25J 9/1664; B25J 11/0095; H01L 21/67259; H01L 21/67766; H01L 21/67742
USPC .................. 700/245; 414/935, 936, 783, 940
See application file for complete search history.

(56) References Cited

U.S. PATENT DOCUMENTS 10,228,303 B2 * 3/2019 Lazic ..................... B23Q 17/20
10,293,479 B2 * 5/2019 Yoshimura ............... B25J 9/047
10,981,278 B2 * 4/2021 Haddadin ................ B25J 13/06
11,148,289 B1 * 10/2021 Brady .................... B25J 13/085
2020/0144097 A1 * 5/2020 Thaulad ............ H01L 21/68785

FOREIGN PATENT DOCUMENTS

JP 2009-253286 A 10/2009
KR 10-2014-0042190 A 4/2014
KR 10-1613135 B1 4/2016

* cited by examiner

*Primary Examiner* — Dalena Tran

(57) ABSTRACT

Provided are an end effect measuring module and an end effect monitoring apparatus using the same. The end effect measuring module is installed at through holes formed between an Equipment Front End Module (EFEM) equipped with an end effector and a semiconductor processing apparatus for processing a wafer and measuring the position according to the movement path of a target passing the through holes. The measurement target is the end effector, and a sensing unit measures whether or not the end effector is shifted and changed in direction. A light receiving unit of the sensing unit outputs an electrical signal that is higher or lower than a reference value in response to shifting of the end effector, or outputs an electrical signal increasing or decreasing along a time axis in response to a directional change of the end effector.

5 Claims, 10 Drawing Sheets

20 30 21 31 21a 10 11 12 22 32

END EFFECTOR MEASURING MODULE AND END EFFECTOR MONITORING APPARATUS USING THE SAME

CROSS-REFERENCE TO RELATED APPLICATIONS

This application is a continuation-in-part application of PCT International Patent Application No. PCT/KR2019/015769, filed on Nov. 18, 2019, which claims priority of Korean Patent Application No. 10-2019-0021277, filed on Feb. 22, 2019, the entire contents of which are incorporated herein by reference.

BACKGROUND

The present invention relates to an end effector measuring module and an end effector monitoring apparatus using the end effector measuring module, and more particularly, to an end effector measuring module and an end effector monitoring apparatus using the end effector measuring module wafer, which is installed at a supply port through which a wafer enters a semiconductor processing equipment from an Equipment Front End Module (EFEM) to measure an end effector's movement path and monitor the distortion of the end effector using a measured movement path.

In a general semiconductor manufacturing process, wafer processing is performed in a clean room in order to improve the yield and quality.

As the high integration of elements, the miniaturization of circuits, and the enlargement of wafer proceed, it is highly technical and cost-effective to keep the entire interior of a clean room clean.

Recently, cleanliness is managed with respect to only a space around a wafer. FIG. 1 is an exemplary view illustrating a semiconductor processing apparatus using a typical wafer, and FIG. 2 is another exemplary view illustrating the semiconductor processing apparatus using a wafer according to FIG. 1.

As shown in FIGS. 1 and 2, a wafer is stored in a sealed storage pod called a Front Opening Unified Pod (FOUP) 11, fixed on a load port 10. An Equipment Front End Module (EFEM) 20 is used as a wafer transfer apparatus for transferring wafers between the FOUP 11 and a semiconductor processing apparatus 30 for processing wafers.

The EFEM 20 includes a wafer transfer chamber equipped with a wafer transfer apparatus, and the load port 10 coupled to the FOUP 11 is connected to one side of the wafer transfer chamber.

Also, the semiconductor processing apparatus 30 is connected to the other side of the wafer transfer chamber of the EFEM 20 through a through hole 22, and a wafer stored inside the FOUP 11 is transferred by an end effector 21*a* of a robot arm 21, or a wafer processed in the semiconductor processing apparatus 30 is transferred into the FOUP 11 by the end effector 21*a*.

The semiconductor processing apparatus 30 transfers a wafer loaded onto a stage 31 by the end effector 21*a* of the robot arm 21 to the processing equipment through a robot arm 32 such that processing can be performed on the wafer.

However, when the end effector 21*a* collides with the stage 31 or the inner wall in the process of raising a wafer on the stage 31 or removing a wafer from the stage 31, the wafer may be damaged and particles may occur.

Also, the robot arm 21 is configured to move a plurality of joints using a chain or a belt. In this case, if the robot arm 21 moves along a designed path, the robot arm 21 accurately moves along a predetermined path without a directional change, but when the belt or the chain is loosened, the path may be changed.

Also, Korean Patent No. 10-1613135 (title: device and method for detecting position of semiconductor substrate) discloses a position detection apparatus which accurately detects the center position coordinates of a disc-shaped substrate from image data photographed by a camera, calculates a positional shift amount on a support member of the disc-shaped substrate that is being transferred during processing, and performs position correction such that the substrate can be placed on an accurate mounting position.

However, the position detection apparatus according to the related art has limitations in that the configuration is complicated and the size of the apparatus is increased by using a camera.

Also, since the center position coordinates of the substrate using the data extracted from the image data are calculated, there is a limitation in that the data calculation process becomes complicated.

PRIOR ART DOCUMENT

Patent Document (Patent Document 1) 1. Korean Patent No. 10-1613135 (title: device and method for detecting position of semiconductor substrate)

SUMMARY

The present invention provides an end effector measuring module and an end effector monitoring apparatus using the end effector measuring module, which is installed at a supply port through which a wafer enters a semiconductor processing equipment from an Equipment Front End Module (EFEM) to measure an end effector's movement path and monitor the directional change of the end effector using a measured movement path.

Embodiments of the inventive concept provide end effect measuring modules being installed at through holes formed between an Equipment Front End Module (EFEM) equipped with an end effector and a semiconductor processing apparatus for processing a wafer and measuring the position according to the movement path of a target passing the through holes, wherein: the measurement target is the end effector; the measurement of the movement path of the end effector is whether or not the end effector is shifted and changed in direction; whether or not the end effector is shifted and changed in direction is performed through a sensing unit including a light emitting unit and a light receiving unit disposed orthogonally to the movement path of the end effector; and the light receiving unit outputs an electrical signal that is higher or lower than a reference value in response to shifting of the end effector, or outputs an electrical signal increasing or decreasing along a time axis in response to a directional change of the end effector.

In some embodiments, the light emitting unit may be disposed such that measurement light is irradiated from a lower side of the end effector in an upward direction, and the light receiving unit may output an electrical signal in response to the amount of received light changed according to the movement of the end effector.

In other embodiments, the end effector measuring module may further include a measuring module body which supports the light emitting unit and the light receiving unit such that the light emitting unit and the light receiving unit are fixed to face each other.

In other embodiments of the inventive concept, end effect monitoring apparatuses includes: an end effector measuring module; and a controller comparing an electrical signal outputted from the end effector measuring module with a preset reference value and determining according to the comparison result whether or not a movement path of an end effector is changed.

In some embodiments, the controller may determine whether or not a change occurs in the electrical signal along a time axis; and may determine a shift direction of the end effector using whether the electrical signal higher or lower than the reference value and determines a directional change of the end effector using whether the electrical signal increases or decreases along a time axis.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Hereinafter, an end effector monitoring apparatus using an end effector measuring module according to an embodiment of the present invention will be described through exemplary embodiments.

(Measurement Module)

Figure 1:
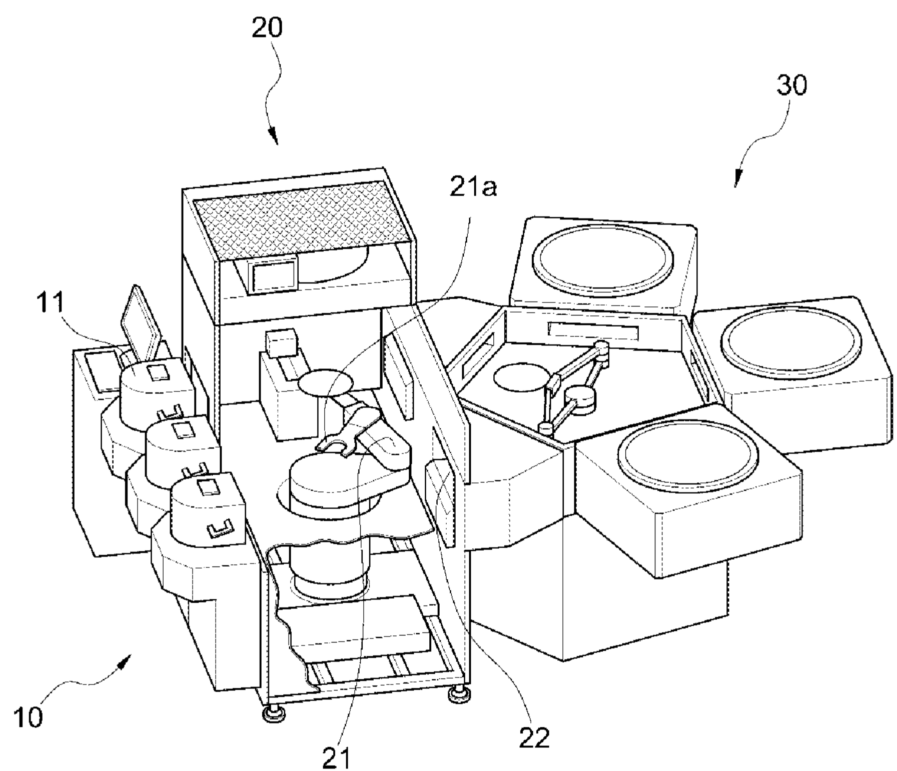
FIG. 1 is an exemplary view illustrating a semiconductor processing apparatus using a typical wafer.
Figure 2:
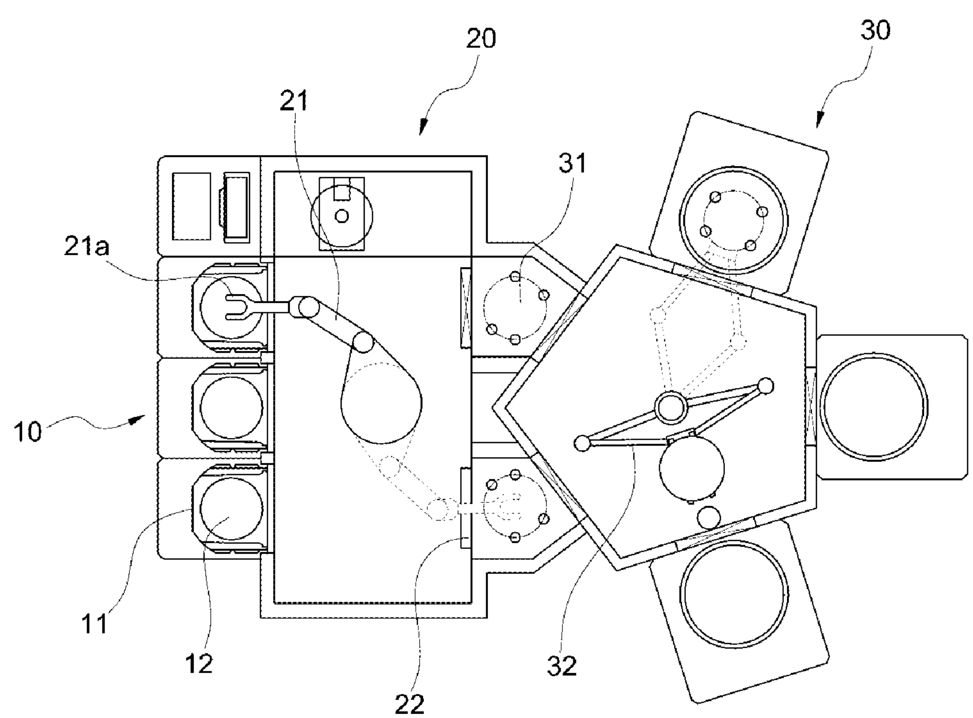
FIG. 2 is another exemplary view illustrating a semiconductor processing apparatus using a wafer of FIG. 1.
Figure 3:
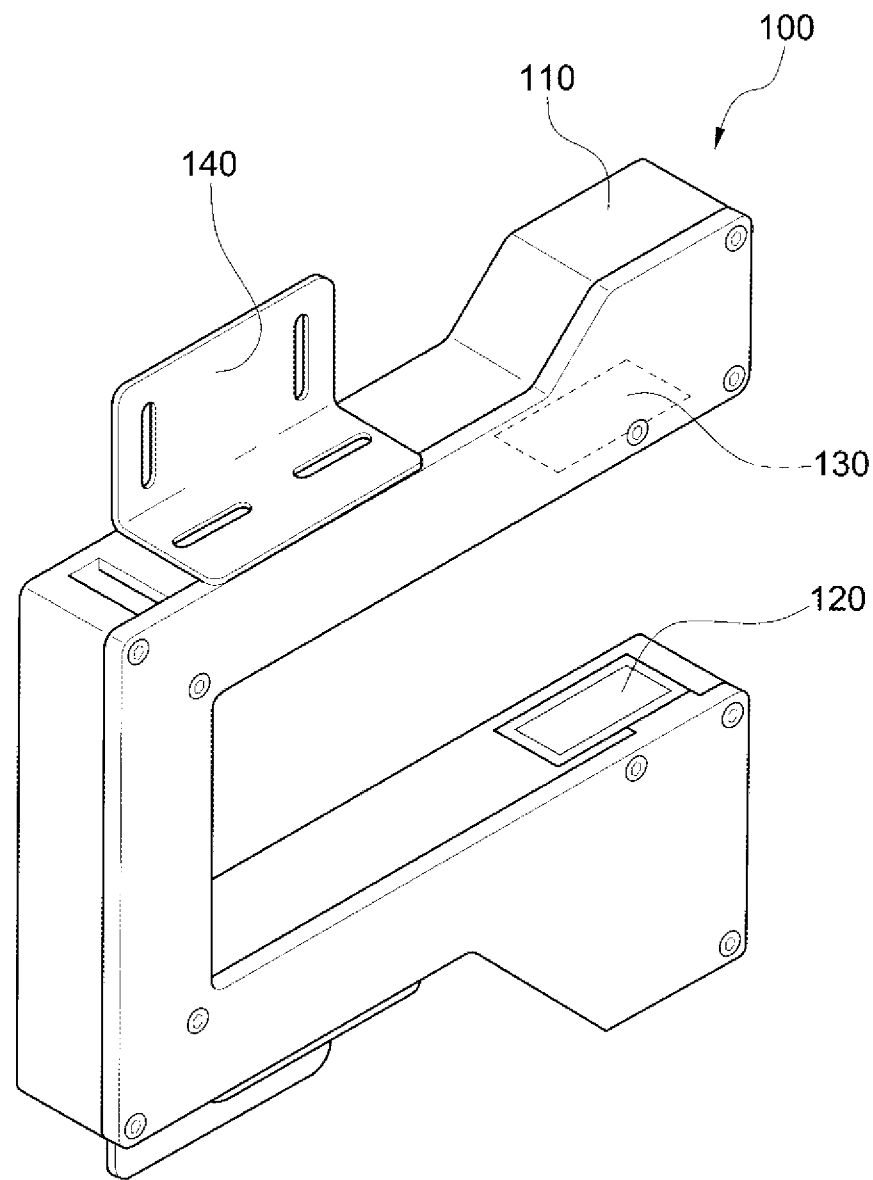
FIG. 3 is a perspective view illustrating an end effector measuring module according to an embodiment of the present invention.

FIG. 3 is a perspective view illustrating an end effector measuring module according to an embodiment of the present invention.

As shown in FIG. 3, an end effector measuring module 100 according to an embodiment of the present invention is installed in a through hole formed between an Equipment Front End Module (EFEM) including an end effector and a semiconductor processing apparatus for processing a wafer, and outputs a corresponding electrical signal according to the movement path of the end effector passing through the through hole. The end effector measuring module 100 includes a measuring module body 110, a light emitting unit 120, and a light receiving unit 130.

Also, the end effector measuring module 100 may be installed at a position orthogonal to a movement path via which the end effector 21*a* passes through holes 22 and 22'.

The measuring module body 110 allows the light emitting unit 120 and the light receiving unit 130 to be fixedly supported while facing each other. The light emitting unit 120 may be disposed under the light receiving unit 130 such that the light emitting unit 120 and the light receiving unit 130 may be installed at positions opposite to each other.

For this, the measuring module body 110 may be configured to have upper and lower parts. The cross-sectional shape of the measuring module body 110 may be configured to have a C-shape or a rectangular shape whose upper and lower parts are connected to each other.

Also, the measuring module body 110 may be fixed around the through holes 22 and 22' through a bracket 140.

The light emitting unit 120 outputs a measurement light of a predetermined wavelength range, and may be formed of a light emitting element such as an LED.

Also, the light emitting unit 120 may be disposed under the measuring module body 110 such that the measurement light is irradiated from the lower side of the end effector 21*a* in an upward direction.

The light emitting unit 120 is disposed under the measuring module body 110 to prevent light outputted from the light emitting unit 120 from damaging a pattern formed on the upper surface of a wafer 12. For this, the measurement light is allowed to be irradiated from the lower side to the upper side of the wafer 12.

Since the pattern is not formed on the rear surface of the wafer 12, it does not matter whether the measurement light is irradiated on the rear surface of the wafer 12.

The light receiving unit 130 receives measurement light outputted from the light emitting unit 120, and outputs an output value variable according to the amount of light received as an electrical signal. The light receiving unit 130 includes a light receiving element that converts an optical signal into an electrical signal to output when an optical signal of a photo diode, PDS, etc.

That is, the light receiving unit 130 outputs a corresponding electrical signal according to the amount of the received measurement light covered and reduced by the movement of the end effector 21*a*.

(Monitoring Apparatus)

Figure 4:
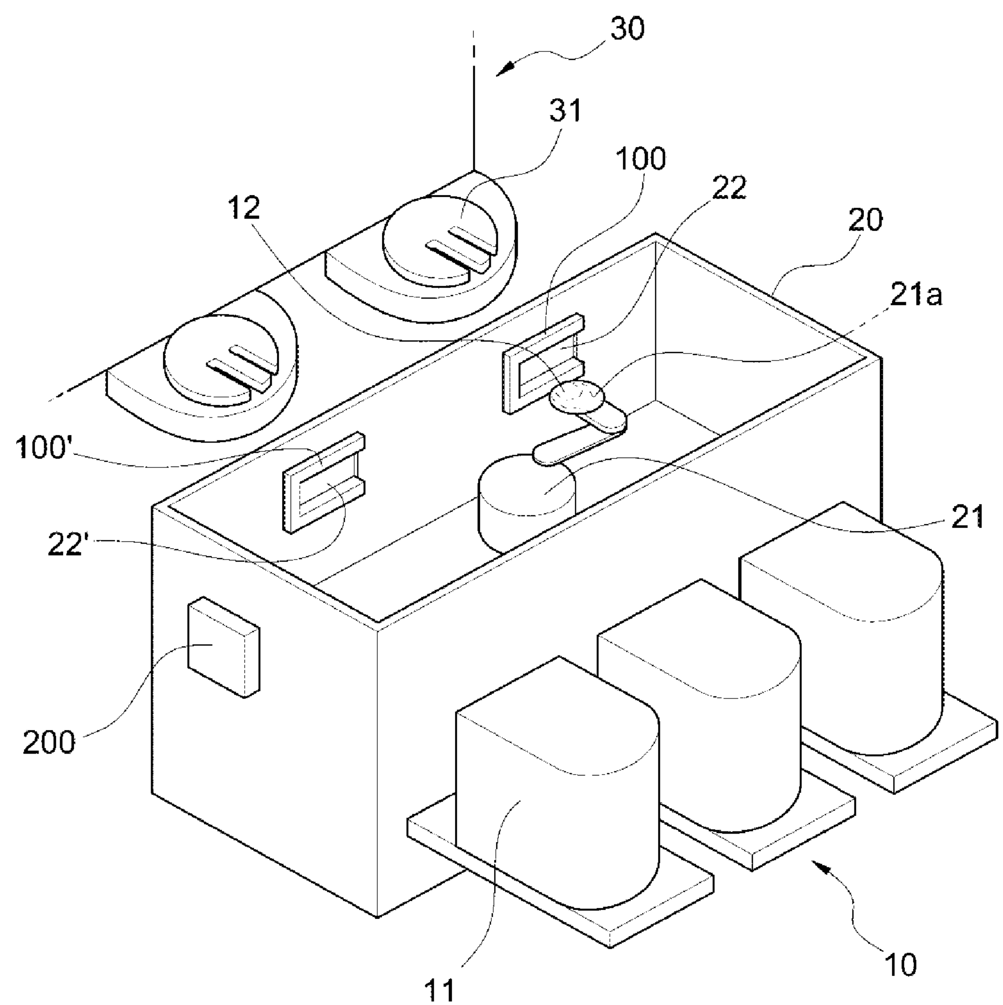
FIG. 4 is a perspective view illustrating an end effector monitoring apparatus using an end effector measuring module according to an embodiment of the present invention.
Figure 5:
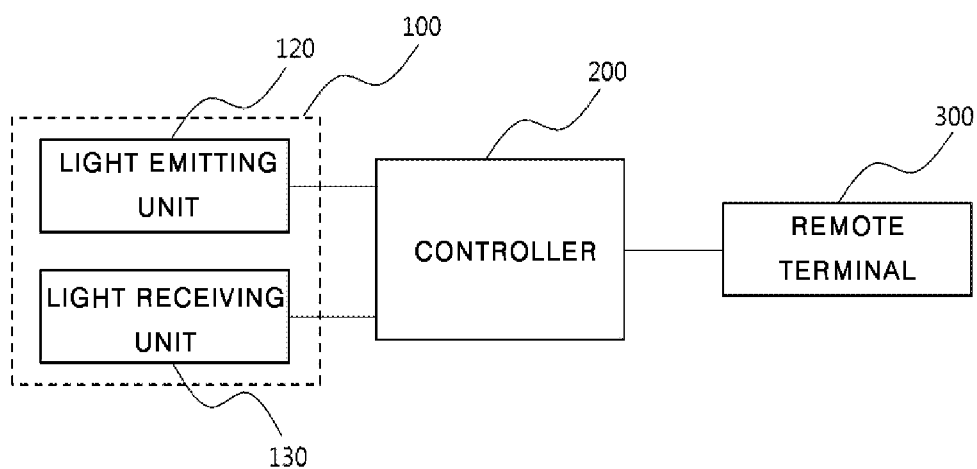
FIG. 5 is a view illustrating a configuration of an end effector monitoring apparatus using the end effector measuring module of FIG. 4.

FIG. 4 is a perspective view illustrating an end effector monitoring apparatus using an end effector measuring module according to an embodiment of the present invention, and FIG. 5 is a view illustrating a configuration of an end effector monitoring apparatus using the end effector measuring module of FIG. 4

As shown in FIGS. 3 to 5, a monitoring apparatus using an end effector measuring module according to an embodiment of the present invention includes end effector measuring modules 100 and 100' and a controller 200. The end effector measuring modules 100 and 100' are installed at through holes 22 and 22' formed between an Equipment Front End Module (EFEM) 20 equipped with an end effector 21*a* and a semiconductor processing apparatus 30 for processing a wafer 12, and measures the position according to the movement path of the end effector 21*a* passing the through holes 22 and 22' to output as an electrical signal.

The end effector measuring module 100 includes a measuring module body 110, a light emitting unit 120, and a light receiving unit 130. The end effector measuring module 100 is fixedly installed around the through holes 22 and 22' by fixing the measuring module body 110 through a bracket 140.

The light emitting unit 120 outputs measurement light of a predetermined wavelength range, and is disposed under the measuring module body 110 such that the measuring light is irradiated from the lower side of the end effector 21*a* in an upward direction.

The light receiving unit 130 is disposed to face the upper part of the light emitting unit 120, and receives the measurement light outputted from the light emitting unit 120 to output an electrical signal in response to the amount of received light.

The controller 200 compares the electrical signal outputted from the end effector measuring modules 100 and 100' with a preset reference value, and according to the comparison result, determines whether or not the movement path of the end effector 21*a* is changed.

Also, the controller 200 checks whether or not a change occurs in the electrical signal outputted from the end effector measuring modules 100 and 100' along a time axis, and determines whether or not thus a change (directional change) occurs in the movement path of the end effector 21*a*.

FIG. 6A-6E show various movement paths via which the end effector 21*a* passes the light receiving unit 130. As shown in FIGS. 6A to 6E, various movement paths may be shown. FIGS. 7A-7F are graphs illustrating voltage distributions according to an operation of an end effector monitoring apparatus using the end effector measuring module according to FIG. 4.

Figure 6A:
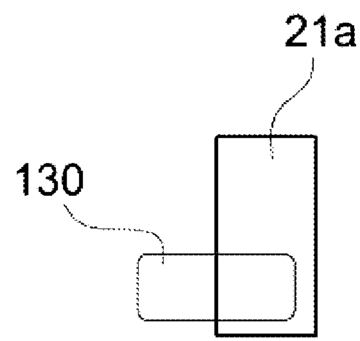
FIGS. 6A-6E are exemplary views illustrating an operation process of an end effector monitoring apparatus using the end effector measuring module of FIG. 4.

FIG. 6A shows that the end effector 21*a* moves along a normal movement path, and the end effector 21*a* moves in a direction orthogonal to the light receiving unit 130 while covering a certain area of the light receiving unit 130, e.g., about 50% area of the light receiving unit 130.

The state where about 50% area of the light receiving unit 130 is covered is a reference for determining whether or not the end effector 21*a* moves along the normal path, thereby enabling to check which direction the end effector 21*a* is changed and shifted or is tilted to.

Figure 7A:
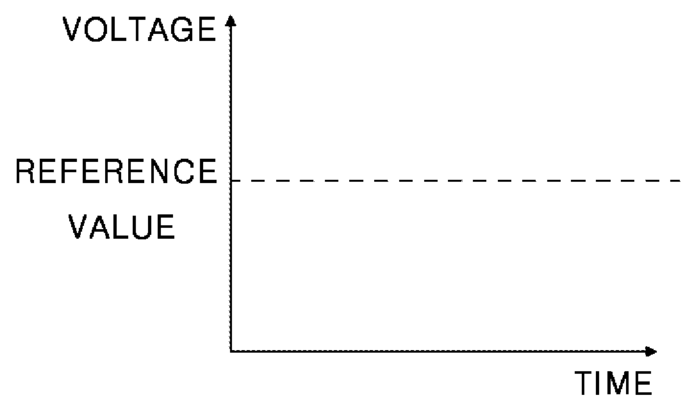
FIGS. 7A-7F are graphs illustrating voltage distributions according to an operation of an end effector monitoring apparatus using the end effector measuring module according to FIG. 4.

That is, when the end effector 21*a* covers about 50% area of the light receiving unit 130, the light receiving unit 130 is covered by half, and in this state, the output value (voltage) of the light receiving unit 130 is set as a reference value as shown in FIG. 7A.

Figure 7B:
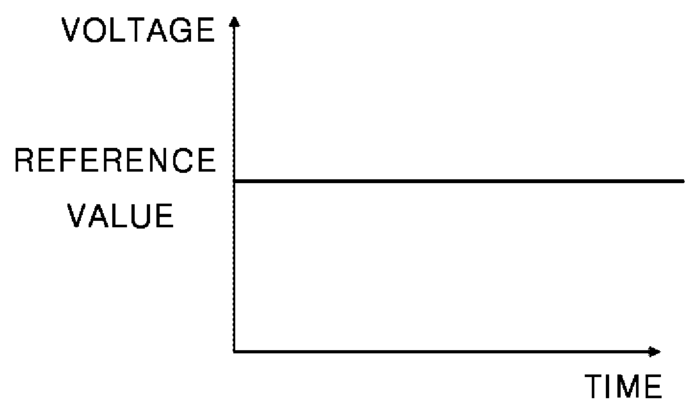

Also, when the end effector 21*a* moves normally, the light receiving unit 130 outputs a voltage value that matches the reference value as shown in FIG. 7B.

Figure 6B:
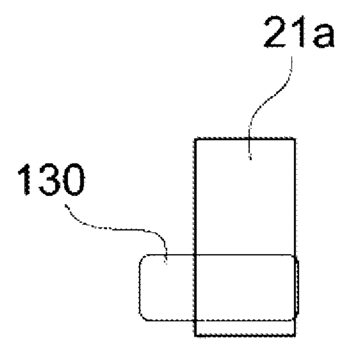
Figure 6C:
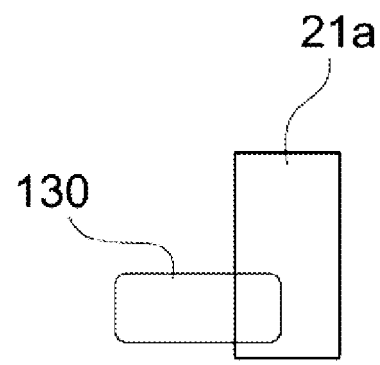

FIGS. 6B and 6C show that the movement path of the end effector 21*a* is changed and shifted. FIG. 6B shows that the end effector 21*a* moves while being further shifted to the left side of the light receiving unit 130, and FIG. 6C shows that the end effector 21*a* moves while being further shifted to the right side of the light receiving unit 130.

Figure 7C:
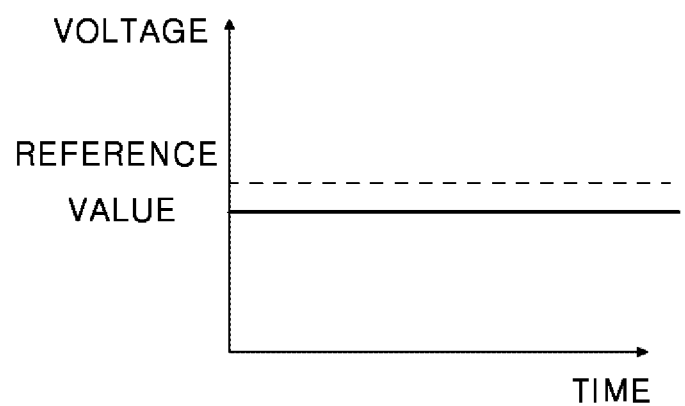

That is, when the end effector 21*a* is shifted to the left side of the light receiving unit 130 as shown in FIG. 6B, the light receiving unit 130 is more covered, and the voltage outputted from the light receiving unit 130 is raised as shown in FIG. 7C.

Figure 7D:
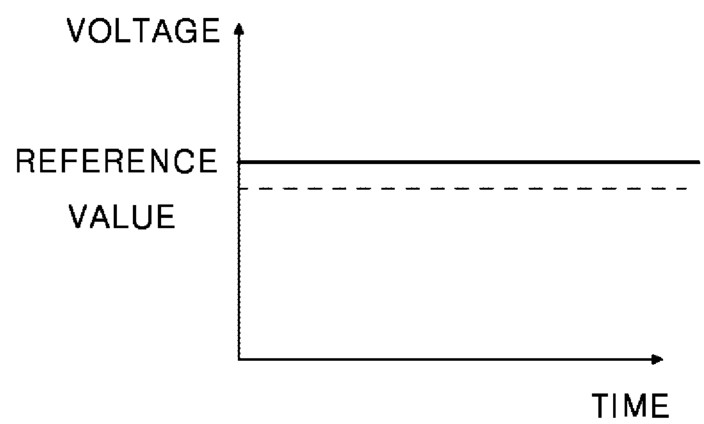

Also, when the end effector 21*a* is shifted to the right side of the light receiving unit 130 as shown in FIG. 6C, the light receiving unit 130 is less covered, and the voltage outputted from the light receiving unit 130 is increased as shown in FIG. 7D.

The changes in the voltage value (or output value) of the light receiving unit 130 show that the movement path itself of the end effector 21*a* is normal but is shifted to the left or right side compared to the normal position.

Figure 6D:
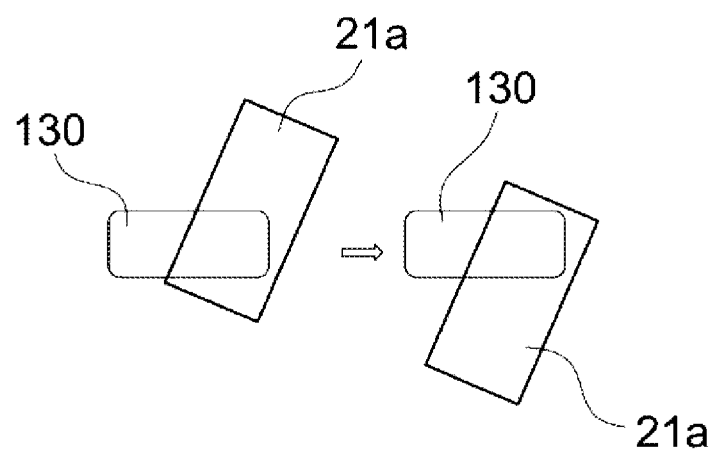
Figure 6E:
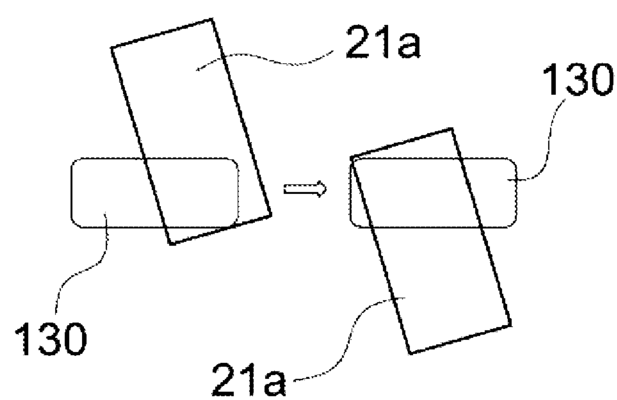

FIGS. 6D and 6E show that the end effector 21*a* moves while being tilted in a certain direction. FIG. 6D shows that the end effector 21*a* moves while being tilted to the right. FIG. 6E shows that the end effector 21*a* moves while being tilted to the left.

Figure 7E:
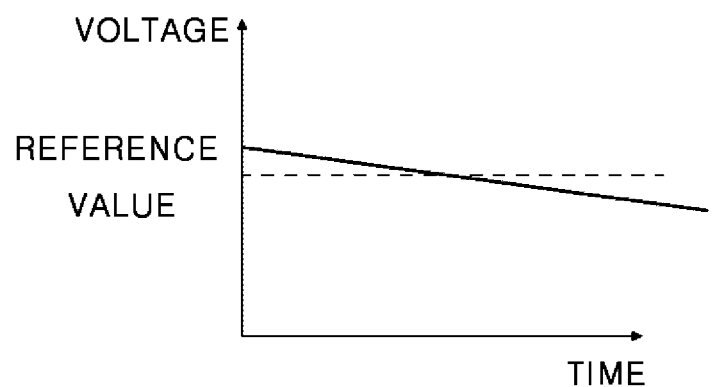

That is, when the end effector 21*a* moves while being tilted to the right as shown in FIG. 6D, the end effector 21*a* more covers the light receiving unit 130 at first, and then as the end effector 21*a* passes, the light receiving unit 130 is covered less and less. As a result, the voltage outputted from the light receiving unit 130 forms a graph in which the voltage value moves from a low value to a high value as time passes, as shown in FIG. 7E.

Figure 7F:
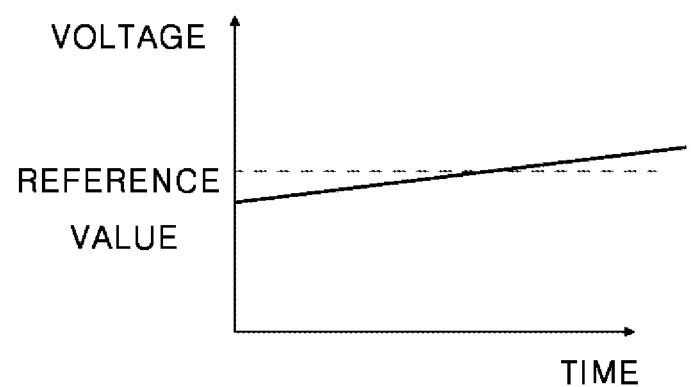

Also, when the end effector 21*a* moves while being tilted to the left as shown in FIG. 6E, the end effector 21*a* less covers the light receiving unit 130 at first, and then as the end effector 21*a* passes, the light receiving unit 130 is covered more and more. As a result, the voltage outputted from the light receiving unit 130 forms a graph in which the voltage value moves from a low value to a high value as time passes, as shown in FIG. 7F.

Accordingly, the controller 200 can determine whether the end effector 21*a* is shifted in one of the left and right directions and determine the tilted direction of the end effector 21*a* by using the voltage value outputted from the light receiving unit 130 to be higher or lower than the reference value or to increase or decrease along the time axis.

On the other hand, when the end effector 21*a* is shifted or tilted, the controller 200 is connected to a remote terminal 300 through a network to transmit whether shifting or tilting occurs in the end effector 21*a*.

Also, the controller 200 may transmit the measured values measured by the end effector measuring modules 100 and 100' to the remote terminal 300, and the remote terminal 300 may analyze the measured values received from the controller 200 to determine whether shifting or tilting occurs in the end effector 21*a*.

Also, when shifting or tilting of the end effector 21*a* occurs, the controller 200 may compare the shifting or tilting with a preset threshold value. According to the comparison result, the controller 200 may transmit a repair request signal for the end effector 21*a* to the remote terminal 300 to allow a manager to easily check the repair request signal.

That is, the maintenance and repair of a robot arm can be easily performed by automatically generating a repair request signal due to the aging of the chain or belt of the robot arm and transmitting an alarm signal.

Accordingly, the occurrence of malfunction of the robot arm can be automatically checked by measuring the movement path of the end effector and monitoring the directional change of the end effector using the measured movement path.

Also, the maintenance and repair of the robot arm can be easily managed by automatically checking the malfunction of the robot arm and providing the malfunction to the manager.

Meanwhile, although it is described in these embodiments that the shifting or tilting of the end effector 21*a* occurs, various monitoring examples illustrated in FIGS. 6B to 6E may include changes of the end effector 21*a* in the vertical direction (Z axis) with respect to the traveling direction.

In this case, a light emitting part (not shown) and a light receiving part (not shown) may be disposed at both sides of the through holes 22 and 22' to measure changes of the end effector 21*a* in the vertical direction (Z axis). The light emitting unit and the light receiving unit which are not shown may perform the same functions as the light emitting unit 120 and the light receiving unit 130 described above.

As another method, a change of the end effector 21*a* in the vertical direction (Z-axis) may be checked by combining a time difference at which the voltage values are outputted and a voltage value generated in response to the covered area of the light receiving unit 130.

According to an embodiment of the present invention, an end effector monitoring apparatus using an end effector measuring module wafer is installed at a supply port through which a wafer enters a semiconductor processing equipment from an Equipment Front End Module (EFEM) to measure an end effector's movement path and monitor the directional change of the end effector using a measured movement path, thereby automatically checking a malfunction of a robot arm.

Also, since it is possible to automatically check the occurrence of malfunction of the robot arm to provide to the administrator, etc., the maintenance and repair of the robot arm can be easily performed.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An end effect measuring module being installed at through holes formed between an Equipment Front End Module (EFEM) equipped with an end effector and a semiconductor processing apparatus for processing a wafer and measuring a position according to a movement path of a target passing the through holes, wherein:

the measurement target is the end effector;

the measurement of the movement path of the end effector is whether or not the end effector is shifted and changed in direction;

whether or not the end effector is shifted and changed in direction is performed through a sensing unit comprising a light emitting unit and a light receiving unit disposed orthogonally to the movement path of the end effector; and the light receiving unit outputs an electrical signal that is higher or lower than a reference value in response to shifting of the end effector, or outputs an electrical signal increasing or decreasing along a time axis in response to a directional change of the end effector.

2. The end effect measuring module of claim 1, wherein the light emitting unit is disposed such that measurement light is irradiated from a lower side of the end effector in an upward direction, and the light receiving unit outputs an electrical signal in response to the amount of received light changed according to the movement of the end effector.

3. The end effect measuring module of claim 2, wherein the end effector measuring module further comprises a measuring module body which supports the light emitting unit and the light receiving unit such that the light emitting unit and the light receiving unit are fixed to face each other.

4. An end effect monitoring apparatus comprising:

an end effector measuring module of claim 1; and a controller comparing an electrical signal outputted from the end effector measuring module with a preset reference value and determining according to the comparison result whether or not a movement path of an end effector is changed.

5. The end effect monitoring apparatus of claim 4, wherein the controller determines whether or not a change occurs in the electrical signal along a time axis; and determines a shift direction of the end effector using whether the electrical signal higher or lower than the reference value and determines a directional change of the end effector using whether the electrical signal increases or decreases along a time axis.

* * * * *